(12) United States Patent
Lee et al.

(10) Patent No.: US 11,239,261 B2
(45) Date of Patent: Feb. 1, 2022

(54) DISPLAY DEVICE

(71) Applicant: Samsung Display Co., Ltd., Yongin-si (KR)

(72) Inventors: Cheol-Gon Lee, Suwon-si (KR); Il-Joo Kim, Hwaseong-si (KR); Mee Hye Jung, Suwon-si (KR); Jun Ki Jeong, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 221 days.

(21) Appl. No.: 15/347,177

(22) Filed: Nov. 9, 2016

(65) Prior Publication Data

US 2018/0130828 A1    May 10, 2018

(30) Foreign Application Priority Data

Nov. 4, 2016    (KR) .................. 10-2016-0044388

(51) Int. Cl.
*H01L 27/12*    (2006.01)
*H01L 27/32*    (2006.01)
(Continued)

(52) U.S. Cl.
CPC ........ *H01L 27/1255* (2013.01); *H01L 27/124* (2013.01); *H01L 27/3262* (2013.01);
(Continued)

(58) Field of Classification Search
CPC ... H01L 27/12; H01L 27/1255; H01L 27/124; H01L 27/3262; H01L 27/3276;
(Continued)

(56) References Cited

U.S. PATENT DOCUMENTS

2006/0102897 A1* 5/2006 Suh ................ H01L 51/0545
257/40
2011/0037931 A1* 2/2011 Im ................ G02F 1/134363
349/113
(Continued)

FOREIGN PATENT DOCUMENTS

KR    10-2006-0099143    *  9/2006  ............ H01L 27/12
KR    10-2007-0072114       7/2007
KR    10-2014-0056545       5/2014

*Primary Examiner* — Kenneth Parker
*Assistant Examiner* — Christopher A Culbert
(74) *Attorney, Agent, or Firm* — H.C. Park & Associates, PLC

(57) ABSTRACT

A display device having a gate driver which may reduce generation of ripple at the output of the gate drive includes: a substrate; and a driver circuit including a thin film transistor disposed on the substrate, the thin film transistor including: a first gate electrode disposed on the substrate; a semiconductor layer disposed on the first gate electrode to overlap a part of the first gate electrode, the semiconductor layer including channel, source, and drain regions; a second gate electrode disposed on the semiconductor layer; and a source electrode and a drain electrode disposed on the semiconductor layer and respectively connected to the source region and the drain region, wherein a first area formed by the overlapping portion of the first gate electrode and the drain region has a different size than a second area formed by the overlapping portion of the first gate electrode and the source region.

15 Claims, 7 Drawing Sheets

(51) Int. Cl.
  *H01L 29/786* (2006.01)
  *G02F 1/1362* (2006.01)
  *G02F 1/1368* (2006.01)
(52) U.S. Cl.
  CPC .... *H01L 27/3276* (2013.01); *H01L 29/78648* (2013.01); *H01L 29/78696* (2013.01); *G02F 1/1368* (2013.01); *G02F 1/136213* (2013.01); *H01L 27/1225* (2013.01); *H01L 29/7869* (2013.01)
(58) Field of Classification Search
  CPC ......... H01L 29/78648; H01L 29/78696; H01L 29/7869; G02F 1/136213; G02F 1/1368
  See application file for complete search history.

(56) References Cited

U.S. PATENT DOCUMENTS

| | | |
|---|---|---|
| 2015/0268530 A1 | 9/2015 | Xu et al. |
| 2015/0280000 A1 | 10/2015 | Seon et al. |
| 2016/0149045 A1* | 5/2016 | Tanaka ................ H01L 27/1225 257/315 |
| 2017/0018577 A1* | 1/2017 | Matsuda ........... H01L 29/78696 |
| 2017/0234730 A1* | 8/2017 | Kurokawa ........ H01L 27/14645 250/208.1 |

* cited by examiner

DISPLAY DEVICE

CROSS-REFERENCE TO RELATED APPLICATION

This application claims priority from and the benefit of Korean Patent Application No. 10-2016-0044388, filed on Apr. 11, 2016, which is hereby incorporated by reference for all purposes as if fully set forth herein.

BACKGROUND

Field

The invention generally relates to a display device and, more particularly, to a display device that may reduce the width of the gate driver that activates the pixels in the display while reducing or preventing ripple (noise) in the gate driver signals.

Discussion of the Background

A display device such as a liquid crystal display (LCD) and an organic light emitting diode display (OLED) includes a display panel displaying an image and a driver circuit such as a gate driver and a data driver to drive the display panel. The driver circuit may be formed of a separate chip and may be electrically connected to the display panel. Recently, a technique for integrating the gate driver in the display panel without forming a separate chip has been developed.

The gate driver includes a transistor as a switching element and a capacitor as a storage element. When the gate driver is integrated in the display panel, the gate driver may be disposed in a peripheral area of the display panel, which is disposed outside of the area in which the image is displayed. To reduce the width of a bezel of the display device, the peripheral area of the display panel must also be reduced. However, when disposing the gate driver in the peripheral area of the display panel, there is a limit to how much the width of the peripheral area may be reduced due to issues such as noise or ripple effects in the gate driver signals.

The above information disclosed in this Background section is only for enhancement of understanding of the background of the inventive concepts, and, therefore, it may contain information that does not form the prior art that is already known in this country to a person of ordinary skill in the art.

SUMMARY

The invention provides a display device capable of reducing the width of the gate driver. For example, by reducing the area occupied by the capacitor included in the gate driver, the width of the gate driver may be reduced. Also, by reducing the width of the gate driver, the width of the bezel of the display device may be reduced.

Also, the invention provides a display device that may reduce or prevent a ripple generated from a signal output through the gate driver.

Additional aspects of the invention will be set forth in the detailed description which follows, and, in part, will be apparent from the disclosure, or may be learned by practice of the inventive concepts.

A display device constructed according to the principles of the invention may include: a substrate; and a driver circuit including a thin film transistor disposed on the substrate, the thin film transistor including: a first gate electrode disposed on the substrate; a semiconductor layer disposed on the first gate electrode to overlap a part of the first gate electrode, the semiconductor layer including a channel region, a source region, and a drain region; a second gate electrode disposed on the semiconductor layer; and a source electrode and a drain electrode disposed on the semiconductor layer and connected to the source region and the drain region, respectively, wherein a first area formed by the overlapping portion of the first gate electrode and the drain region has a different size than a second area formed by the overlapping portion of the first gate electrode and the source region.

The first area may be larger than the second area.

The first gate electrode and the second gate electrode may be connected to each other.

The substrate may include a display area where a plurality of pixels are disposed and a peripheral area enclosing the display area.

The driver circuit may be disposed in the peripheral area and configured to drive the plurality of pixels.

A capacitor connected to the thin film transistor may be further included.

The capacitor may include: a first capacitor electrode disposed on the substrate; a second capacitor electrode disposed on the first capacitor electrode; and a dielectric layer interposed between the first capacitor electrode and the second capacitor electrode.

A ratio of the first parasitic capacitance to a sum of the second parasitic capacitance and the first capacitance may be equal to greater than about 1 to 8.

The first capacitor electrode may be connected to the second gate electrode, and the second capacitor electrode may be connected to the drain electrode.

A first insulating layer disposed between the first gate electrode and the second gate electrode may be further included.

The first insulating layer may have a first contact hole, and the first gate electrode and the second gate electrode may be connected to each other through the first contact hole.

According to another exemplary aspect of the invention, a display device includes: a substrate including a display area and a peripheral area; and a gate driver disposed in the peripheral area, the gate driver including: a plurality of thin film transistors arranged in one line along a first direction, each of the plurality of thin film transistors including: a first gate electrode; a semiconductor layer disposed on the first gate electrode, the semiconductor layer including a channel region, a source region, and a drain region; a source electrode and a drain electrode disposed on the semiconductor layer and connected to the source region and the drain region, respectively; and a second gate electrode disposed on the semiconductor layer, the second electrode overlapping the channel region; and a capacitor disposed adjacent to the plurality of thin film transistors; the capacitor includes a first capacitor electrode and a second capacitor electrode, wherein a first area formed by the overlapping portion of the first gate electrode and the drain region has a different size than a second area formed by the overlapping portion of the first gate electrode and the source region, and wherein the first capacitor electrode electrically connected to the second gate electrode and the second capacitor electrode is electrically connected to the drain electrode of each of the plurality of thin film transistors.

The source electrodes of each of the plurality of thin film transistors are formed of a first contiguous conductor; the drain electrodes of each of the plurality of thin film transistors are formed of a second contiguous conductor; the first gate electrodes of each of the plurality of thin film transistors are formed of a third contiguous conductor; and the second gate electrodes of each of the plurality of thin film transistors are formed of a fourth contiguous conductor.

The first capacitor electrode may be formed of the same layer with the same material as the continuous second gate electrode; and the second capacitor electrode may be formed of the same layer with the same material as the continuous drain electrode.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concept.

DETAILED DESCRIPTION OF THE EMBODIMENTS

Figure 1:
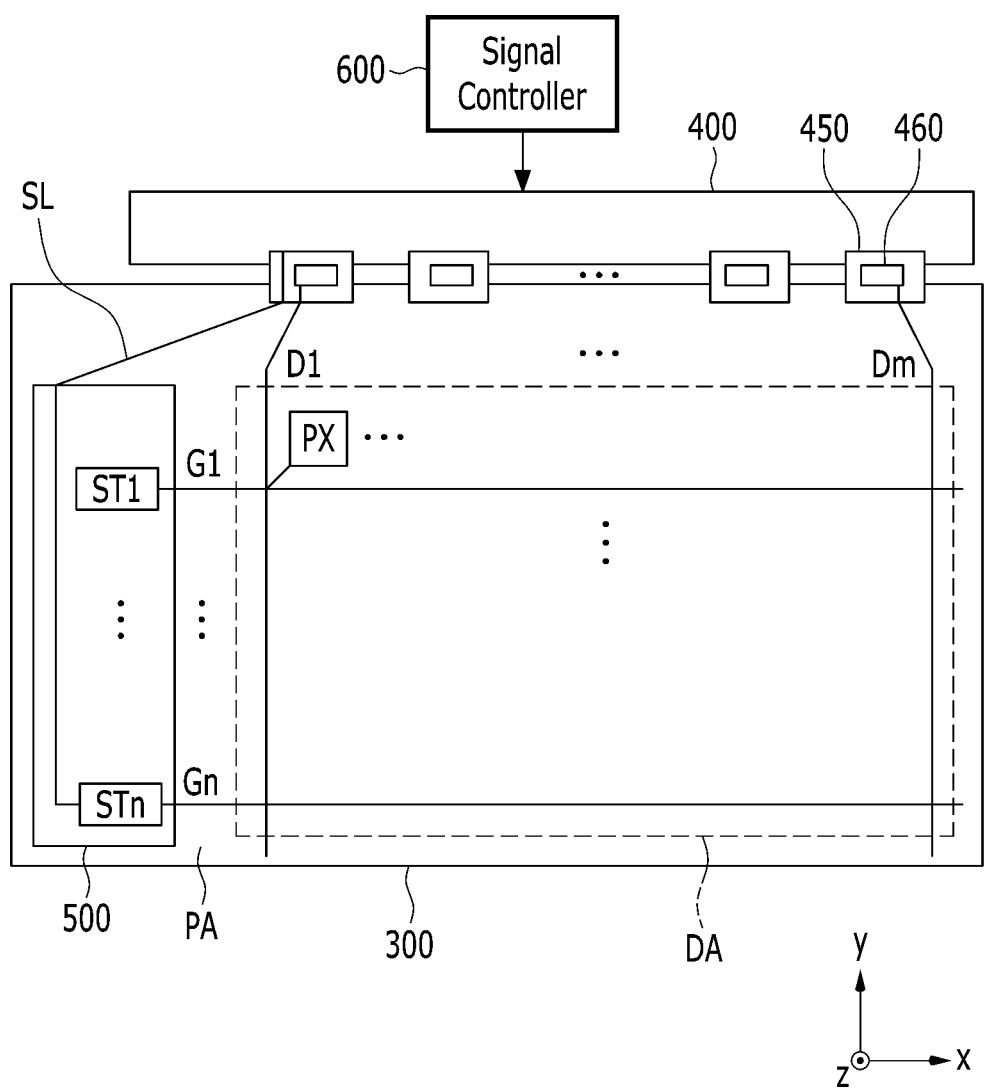
FIG. 1 is a plan view schematically showing a configuration of a display device according to an exemplary embodiment of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Now, a display device according to an exemplary embodiment will be described with reference to FIG. 1 to FIG. 9.

FIG. 1 is a plan view schematically showing a configuration of a display device according to an exemplary embodiment of the invention.

First, an entire structure of the display device according to the exemplary embodiment will be described with reference to FIG. 1. The display device of the exemplary embodiment includes a display panel 300, a data driver 460, a gate driver 500, and a signal controller 600.

The display panel 300 includes a display area DA configured to display the image and a peripheral area PA enclosing the display area DA. In the peripheral area PA, the gate driver 500 configured to apply a gate voltage to gate lines G1-Gn is disposed.

Data lines D1-Dm of the display area DA may be applied with a data voltage from the data driver 460. The data driver 460 may be an integrated chip (IC) formed on a flexible printed circuit board (FPCB) 450 attached to the display panel 300.

The data lines D1-Dm extend from the display area DA to the peripheral area PA, and form at least a part of a fan-out area (not shown) in the peripheral area PA.

The gate driver 500 and the data driver 460 are controlled by the signal controller 600. A printed circuit board (PCB) 400 is disposed outside the flexible printed circuit substrate 450, and may transmit the signal from the signal controller 600 to the data driver 460 and the gate driver 500.

The signal controller 600 may transmit for example, a vertical start signal, a clock signal, and a low voltage signal of a predetermined level, to the gate driver 500 through a plurality of signal lines SL. As discussed in more detail herein, the term clock signal used in the specification and claims broadly encompasses all types of clock signals known in the art.

A plurality of pixels PX are disposed in the display area DA. The display area DA includes a thin film transistor, a storage capacitor, etc. The storage capacitor may be connected to the thin film transistor and may store electrical charges during a predetermined time and maintain a corresponding voltage after the thin film transistor is turned off.

In the case of the liquid crystal display, the display area DA includes a liquid crystal capacitor, and the liquid crystal capacitor includes a pixel electrode, a common electrode, and a liquid crystal layer. The liquid crystal layer may be filled in a microcavity disposed in one or a plurality of pixel area. In the case of the organic light emitting device, the display area DA includes a light-emitting element, and the light-emitting element includes the pixel electrode, the common electrode, and an emission layer. Gate lines G1-Gn and data lines D1-Dm are disposed in the display area DA. The gate lines G1-Gn and the data lines D1-Dm are insulated from each other while crossing each other.

In the case of the liquid crystal display, the pixels PX include the thin film transistor, the liquid crystal capacitor, and the storage capacitor. A control terminal (a gate electrode) of the thin film transistor is connected to the gate line, an input terminal (a source electrode) of the thin film transistor is connected to the data line, and an output terminal (a drain electrode) of the thin film transistor is connected to one terminal of the liquid crystal capacitor and one terminal of the storage capacitor. The other terminal of the liquid crystal capacitor is connected to the common electrode to be applied with a common voltage, and the other terminal of the storage capacitor is applied with the storage voltage.

In the case of the organic light emitting device, the pixels PX include at least two thin film transistors including a switching thin film transistor and a driving thin film transistor, at least one storage capacitor, and the light-emitting element, and may further include at least one compensation thin film transistor.

The data lines D1-Dm are applied with the data voltage from the data driver 460, and the gate lines G1-Gn are applied with the gate voltage from the gate driver 500.

The data driver 460 is disposed at an upper side or a lower side of the display panel 300 and may be connected to the data lines D1-Dm extending in a vertical direction.

The gate driver 500 may receive the vertical start signal, the clock signal, and the low voltage corresponding to the gate-off voltage from the signal controller 600, and generate a gate voltage (including a gate-on voltage and a gate-off voltage) and apply the gate voltage to the gate lines G1-Gn.

The gate driver 500 includes stages ST1-STn configured to generate and output the gate voltage based one the signals received from the signal controller 600, and a plurality of signal lines SL transmitting the signals received from the signal controller 600 to the stages ST1-STn. The signal lines SL may be disposed opposite side from the display area DA with respect to the stages ST1-STn, however the exemplary embodiments are not limited thereto, and at least some of the signal lines SL may be disposed between the stages ST1-STn and the display area DA. The signal lines SL are indicated as one line in FIG. 1, however the signal lines SL may include a number of signal lines, wherein the number of the signal lines may be equal to a number of signals transmitted to the gate driver 500, or may be more or less than the number of the signals transmitted to the gate driver 500.

The gate driver 500 may be integrated in the peripheral area PA of the display panel 300. According to an exemplary embodiment, the gate driver 500 may be mounted to a printed circuit board (PCB) or a flexible printed circuit board as an integrated circuit (IC) chip type to be electrically connected to the display panel 300.

The vertical start signal, the clock signal, and the low voltage may be applied to the gate driver 500 through the flexible printed circuit substrate 450 disposed close to the gate driver 500. These signals may be transmitted to the flexible printed circuit substrate 450 from the outside or the signal controller 600 through the printed circuit board (PCB) 400.

The gate driver 500 may be disposed at the right side and/or the left side of the display area DA, or may be disposed at the upper side and/or the lower side. When the gate driver 500 is disposed at both of the right side and the left side of the display panel, the gate driver disposed at the left side of the display panel may include odd-numbered stages ST1, ST3, . . . and the gate driver disposed at the right side of the display panel may include even-numbered stages ST2, ST4, . . . , or vice versa.

Furthermore, the gate drivers 500 disposed at both of the left side and the right side of the display panel may respectively include all stages ST1-STn. The stages ST1-STn of the gate driver 500 may include a plurality of thin film transistors and at least one capacitor. The thin film transistors and capacitor included in the stages ST1-STn may be manufactured in the same process as the thin film transistor included in the pixels PX of the display area DA.

The gate electrode of the thin film transistor may be formed of the same material with the same layer as the gate line. Constituent elements formed of the same material with the same layer as the gate electrode are hereinafter referred to as a gate conductor. Similarly, the source electrode and the drain electrode of the thin film transistor may be formed of the same material with the same layer as the data line. Constituent elements formed of the same material with the same layer as the source electrode and the drain electrode are hereinafter referred to as a data conductor.

Next, the gate driver of the display device according to an exemplary embodiment will be described with reference to FIG. 2 and FIG. 3.

Figure 2:
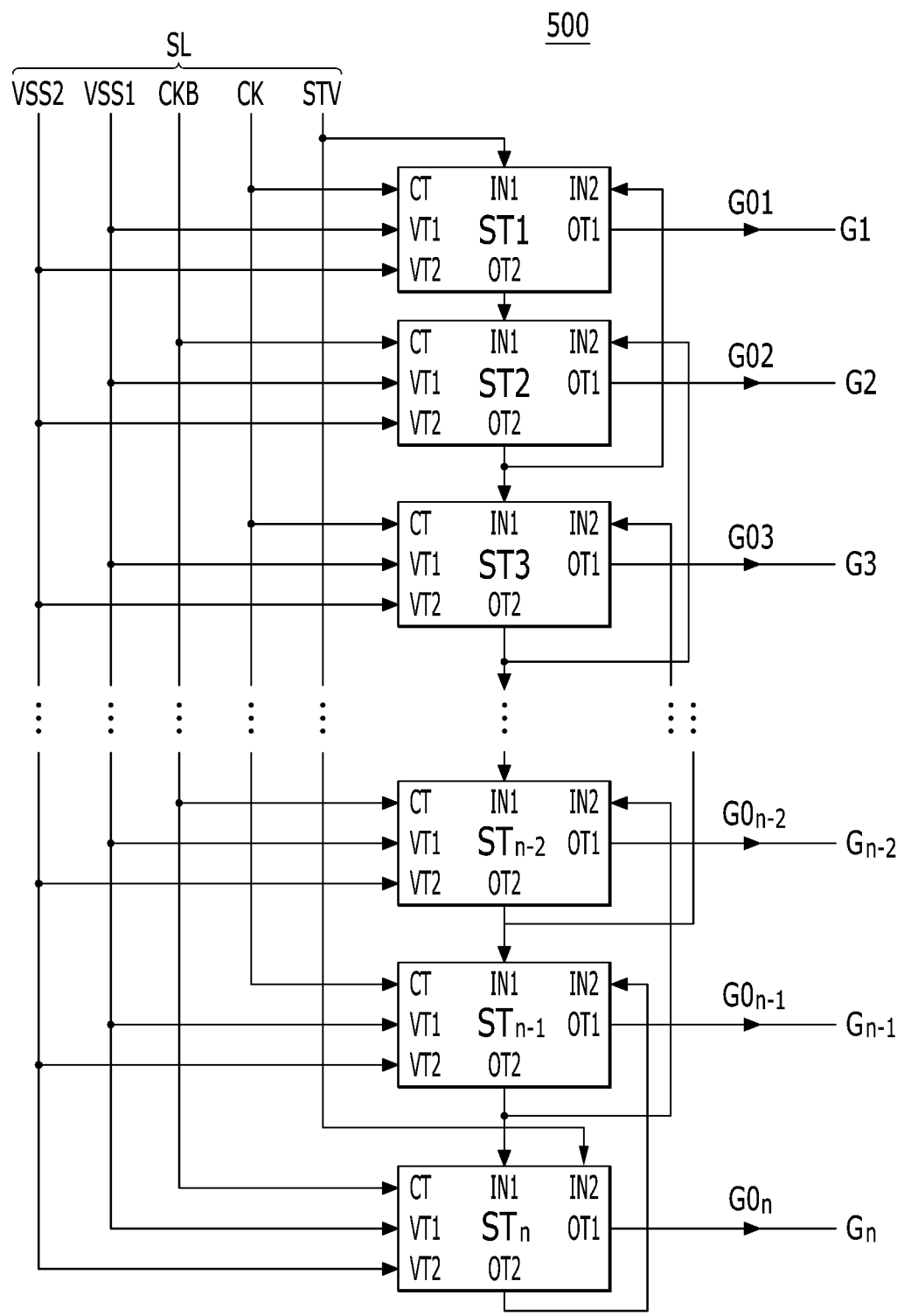
FIG. 2 is a block diagram of a gate driver of a display device constructed according to an exemplary embodiment of the invention.
Figure 3:
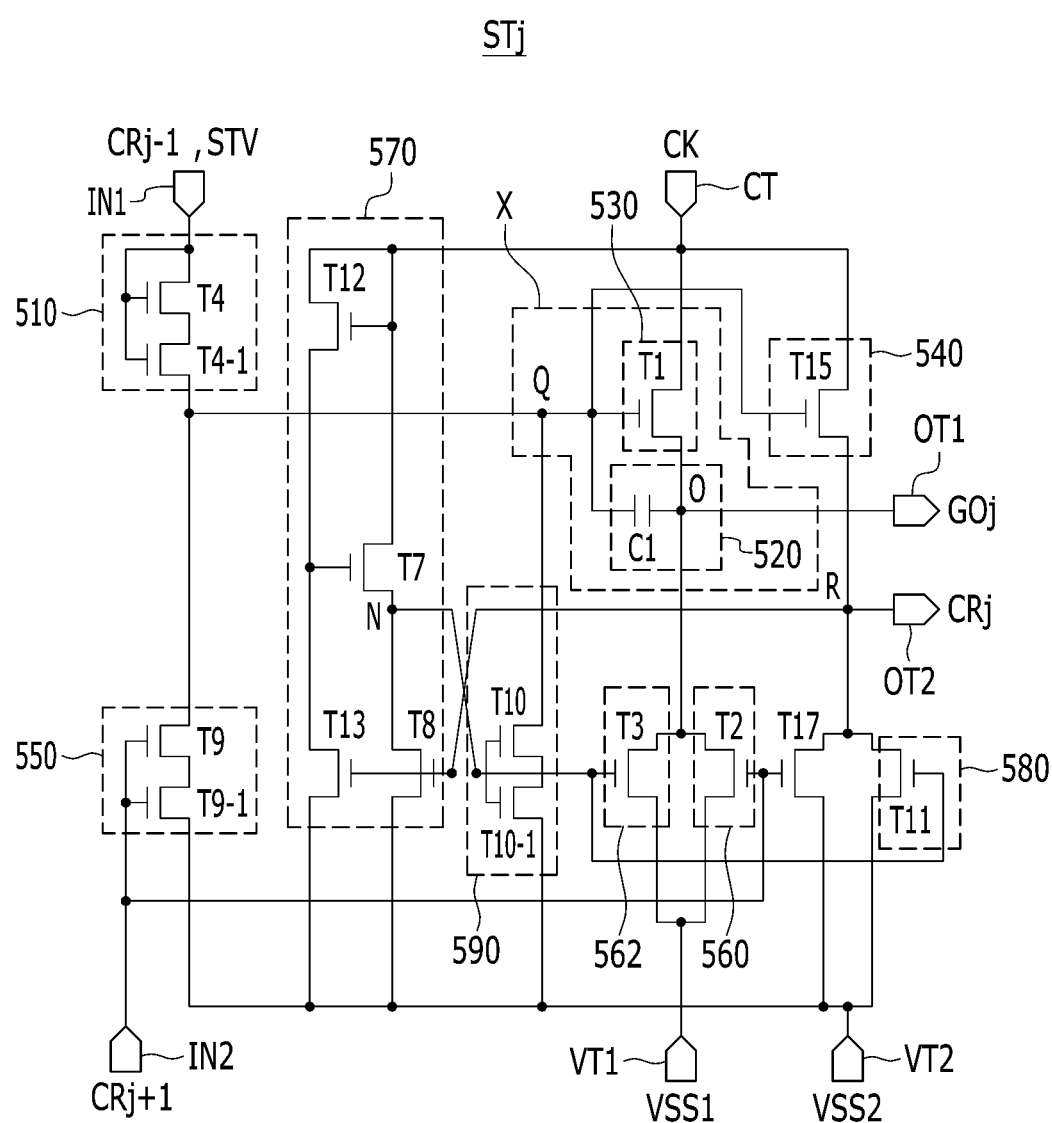
FIG. 3 is a circuit diagram of one stage of a gate driver of a display device constructed according to an exemplary embodiment of the invention.

FIG. 2 is a block diagram of a gate driver of a display device constructed according to an exemplary embodiment of the invention, and FIG. 3 is a circuit diagram of one stage of a gate driver of a display device constructed according to an exemplary embodiment of the invention.

Referring to FIG. 2, the gate driver 500 includes a plurality of stages ST1-STn that are dependently connected to each other. These stages ST1-STn are respectively connected to gate lines G1-Gn, thereby sequentially outputting or transmitting the gate signal to each gate line G1-Gn.

Each stage includes a clock terminal CT, a first input terminal IN1, a second input terminal IN2, a first voltage terminal VT1, a second voltage terminal VT2, a first output terminal OT1, and a second output terminal OT2.

The clock terminal CT receives a clock signal CK or an inversion clock signal CKB, the inversion clock signal CKB being a phase inverted signal of the clock signal CK. According to the exemplary embodiment, the clock terminal CT of the odd-numbered stages ST1, ST3, ... receives the clock signal CK, and the clock terminal CT of the even-numbered stages ST2, ST4, ... receives the inversion clock signal CKB.

The clock signal CK may include any form of periodic signal or non-periodic signal known in the art to control the timing of circuits including, but not limited to, a pure timing signal, a constant frequency clock signal, a qualified (or gated) clock signal, and a dynamic frequency clock signal.

In the j-th stage STj of the 1st to n-th stages ST1-STn, the first input terminal IN1 is connected to the second output terminal OT2 of the previous stage ST (j−1) to receive the carry signal CR(j−1). However, for the 1st stage ST1, the first input terminal IN1 is connected to the vertical start signal STV of the current frame.

The second input terminal IN2 is connected to the second output terminal OT2 of the next stage ST(j+1) to receive the carry signal CR(j+1). However, for the n-th stage STn, the vertical start signal STV is connected to the second input terminal IN2. The vertical start signal STV transmitted to the second input terminal IN2 of the n-th stage STn may be the vertical start signal STV of the next frame.

The first voltage terminal VT1 is connected to a first low voltage VSS1. The first low voltage VSS1 has a first low level corresponding to a discharge level of the gate signal, and for example, may be about −6 V.

The second voltage terminal VT2 is connected to a second low voltage VSS2 having a second low level lower than the first low level. The second low level of second voltage terminal VT2 corresponds to the discharge level of a first node Q (referring to FIG. 3) included in the stage, and for example, may be about −10 V.

The first output terminal OT1 of the stages ST1-STn are electrically connected to the gate lines G1-Gn, respectively, to output the gate signal. The first output terminal OT1 of the 1st to n-th stages ST1-STn are respectively configured to output the first to n-th gate signals GO1-GOn to the corresponding gate lines G1-Gn.

For example, the first output terminal OT1 of the 1st stage ST1 is electrically connected to the 1st gate line G1 to output the first gate signal GO1, and the first output terminal OT1 of the 2nd stage ST2 is electrically connected to the 2nd gate line G2 to output the second gate signal GO2. The first gate signal GO1 is firstly output, and then the second gate signal GO2 is output. Consecutively, the third gate signal to the n-th gate signals GO3-GOn are sequentially output.

The second output terminal OT2 of the j-th stage STj outputs the carry signal CRj. The second output terminal OT2 of the previous stage ST(j−1) is connected to the first input terminal IN1 of the current stage STj, and the second output terminal OT2 of the current stage STj is connected to the second input terminal IN2 of the previous stage ST(j−1).

One stage STj of the gate driver of the display device according to an exemplary embodiment will now be described with reference to FIG. 3.

The j-th stage STj of the gate driver of the display device according to an exemplary embodiment includes a buffer unit 510, a charge unit 520, a pull-up unit 530, a pull-down unit 560, an output node storage unit 562, a carry unit 540, a third node storage unit 580, an inverter unit 570, a discharge unit 550, and a first node storage unit 590.

The buffer unit 510 transmits a carry signal CR(j−1) of the previous stage to the pull-up unit 530. The buffer unit 510 may include a fourth transistor T4. The fourth transistor T4 may include a control terminal and an input terminal connected to the first input terminal IN1, and an output terminal connected to the first node Q.

The buffer unit 510 may further include a fourth additional transistor T4-1. The fourth additional transistor T4-1 may include the control terminal connected to the first input terminal IN1, the input terminal connected to the fourth transistor T4, and the output terminal connected to the first node Q. In this case, the output terminal of the fourth transistor T4 may be connected to the input terminal of the fourth additional transistor T4-1 instead of being directly connected to the first node Q.

The charge unit 520 includes a first capacitor C1 and is charged in response to the carry signal CR(j−1) of the previous stage provided by the buffer unit 510. One terminal of the first capacitor C1 is connected to the first node Q, and the other terminal is connected to the output node O of the gate signal. The first capacitor C1 may be one among capacitors shown in FIGS. 4, 5, and 9. If the high voltage of the carry signal CR(j−1) of the previous stage is received by the buffer unit 510, the charge unit 520 is charged by a first voltage corresponding to the high voltage.

The pull-up unit 530 outputs the gate signal. The pull-up unit 530 may include a first transistor T1. The first transistor T1 includes a control terminal connected to the first node Q, an input terminal connected to the clock terminal CT, and an output terminal connected to the output node O. The output node O is connected to the first output terminal OT1. The first transistor T1 may be a transistor shown in following FIG. 5. The control terminal and the output terminal of the first transistor T1 are respectively connected to one terminal and the other terminal of the first capacitor C1.

In the state that the first voltage charged by the charge unit 520 is applied to the control terminal of the pull-up unit 530, and the high voltage of the clock signal CK is received by the clock terminal CT, the pull-up unit 530 is bootstrapped. In this case, the first node Q connected to the control terminal of the pull-up unit 530 is increased from the first voltage to a boosting voltage. That is, the first node Q is firstly increased to the first voltage, and then is again increased to the boosting voltage.

While the boosting voltage is applied to the control terminal of the pull-up unit 530, the pull-up unit 530 outputs the high voltage of the clock signal CK as the high voltage of the j-th gate signal GOj. The j-th gate signal GOj is output to the gate line Gj through the first output terminal OT1 connected to the output node O.

The pull-down unit 560 pulls down the j-th gate signal GOj. The pull-down unit 560 may include a second transistor T2. The second transistor T2 includes a control terminal connected to the second input terminal IN2, an input terminal connected to the output node O, and an output terminal connected to the first voltage terminal VT1. If the carry signal CR(j+1) of the next stage is received by the second input terminal IN2, the pull-down unit 560 pulls down the voltage of the output node O to the first low voltage VSS1 of the first voltage terminal VT1.

The output node storage unit 562 maintains the voltage of the output node O. The output node storage unit 562 may include a third transistor T3. The third transistor T3 includes a control electrode connected to the second node N, an input electrode connected to the output node O, and an output electrode connected to the first voltage terminal VT1. The output node storage unit 562 maintains the voltage of the output node O as the first low voltage VSS1 applied to the first voltage terminal VT1 in response to the signal of the second node N. The output node storage unit 562 may maintain the voltage of the output node O pulled down to the first low voltage VSS1 with increased stability. The output node storage unit 562 may be omitted.

The carry unit 540 outputs the carry signal CRj. The carry unit 540 may include a fifteenth transistor T15. The fifteenth transistor T15 includes a control terminal connected to the first node Q, an input terminal connected to the clock terminal CT, and an output terminal connected to the third node R. The third node R is connected to the second output terminal OT2.

The carry unit 540 may further include an additional capacitor (not shown) connecting the control terminal and the output terminal of the fifteenth transistor T15. If the high voltage is applied to the first node Q, the carry unit 540 outputs the high voltage of the clock signal CK received by the clock terminal CT as the carry signal CRj. The carry signal CRj is output through the second output terminal OT2 connected to the third node R.

The third node storage unit 580 maintains the voltage of the third node R. The third node storage unit 580 may include an eleventh transistor T11. The eleventh transistor T11 includes a control terminal connected to the second node N, an input terminal connected to the third node R, and an output terminal connected to the second voltage terminal VT2. The third node storage unit 580 maintains the voltage of the third node R as the second low voltage VSS2 in response to the signal of the second node N.

The inverter unit 570 applies the signal having the same phase as the clock signal CK received by the clock terminal CT to the second node N during a period except for the output period of the carry signal CRj. The inverter unit 570 may include a twelfth transistor T12, a seventh transistor T7, a thirteenth transistor T13, and an eighth transistor T8.

The twelfth transistor T12 includes a control terminal and an input terminal connected to the clock terminal CT, and an output terminal connected to an input terminal of the thirteenth transistor T13 and a control terminal of the seventh transistor T7.

The seventh transistor T7 includes the control terminal connected to the thirteenth transistor T13, an input terminal connected to the clock terminal CT, and an output terminal connected to an input terminal of the eighth transistor T8. The output terminal of the seventh transistor T7 is also connected to the second node N.

The thirteenth transistor T13 includes a control terminal connected to the third node R, an input terminal connected to the twelfth transistor T12, and an output terminal connected to the second voltage terminal VT2. The eighth transistor T8 includes a control terminal connected to the third node R, an input terminal connected to the second node N, and an output terminal connected to the second voltage terminal VT2.

While the high voltage is applied to the third node R, the inverter unit 570 discharges the clock signal CK received by the clock terminal CT to the second low voltage VSS2 applied to the second voltage terminal VT2. That is, in response to the high voltage of the third node R, the eighth and thirteenth transistors T8 and T13 are turned on, and thereby the clock signal CK is discharged or transmitted to the second low voltage VSS2. Accordingly, the second node N that is the output node of the inverter unit 570 is maintained as the second low voltage VSS2 while the j-th gate signal GOj is output.

In response to the carry signal CR(j+1) of the next stage, the discharge unit 550 discharges the voltage of the first node Q to the second low voltage VSS2 applied to the second voltage terminal VT2. The discharge unit 550 may include a ninth transistor T9. The ninth transistor T9 includes a control terminal connected to the second input terminal IN2, an input terminal connected to the first node Q, and an output terminal connected to the second voltage terminal VT2.

The discharge unit 550 may further include an additional ninth transistor T9-1. The additional ninth transistor T9-1 may include a control terminal connected to the second input terminal IN2, an input terminal connected to the ninth transistor T9, and an output terminal connected to the second voltage terminal VT2. In this case, the output terminal of the ninth transistor T9 may be connected to the input terminal of the additional ninth transistor T9-1 instead of being directly connected to the second voltage terminal VT2.

If the carry signal CR(j+1) of the next stage is transmitted to the second input terminal IN2, the discharge unit 550 discharges the voltage of the first node Q to the second low voltage VSS2 applied to the second voltage terminal VT2. Accordingly, the voltage of the first node Q which was increased from the first voltage to the boosting voltage is then decreased to the second low voltage VSS2.

According to the above exemplary embodiment, the output terminal of the ninth transistor T9 is connected to the second voltage terminal VT2, however the output terminal of the ninth transistor T9 may be connected to the first voltage terminal VT1.

The first node storage unit 590 maintains the voltage of the first node Q. The first node storage unit 590 may include a tenth transistor T10. The tenth transistor T10 includes a control terminal connected to the second node N, an input terminal connected to the first node Q, and an output terminal connected to the second voltage terminal VT2.

The first node storage unit 590 may further include an additional tenth transistor T10-1. The additional tenth transistor T10-1 includes the control terminal connected to the second node N, the input terminal connected to the tenth additional transistor T10, and the output terminal connected to the second voltage terminal VT2. In this case, the output terminal of the tenth transistor T10 may be connected to the input terminal of the additional tenth transistor T10-1. The first node storage unit 590 maintains the voltage of the first node Q as the second low voltage VSS2 in response to the signal of the second node N.

The overall structure of the display device is described with reference to FIG. 1 to FIG. 3. Now, the gate driver according to an exemplary embodiment will be described in detail with reference to FIG. 4 to FIG. 9.

Figure 4:
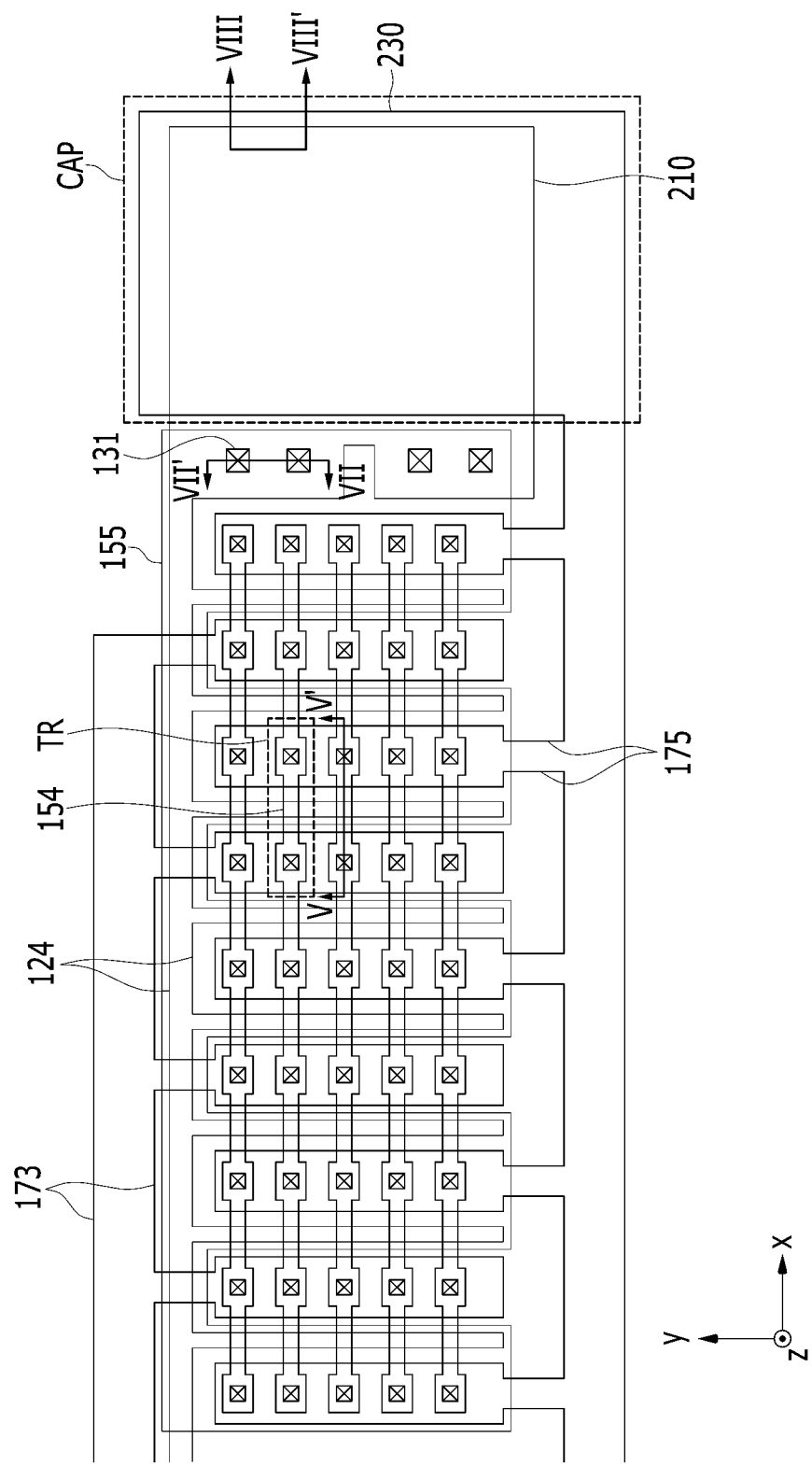
FIG. 4 is a layout view of a thin film transistor and a capacitor included in a gate driver of a display device according to an exemplary embodiment of the invention.
Figure 5:
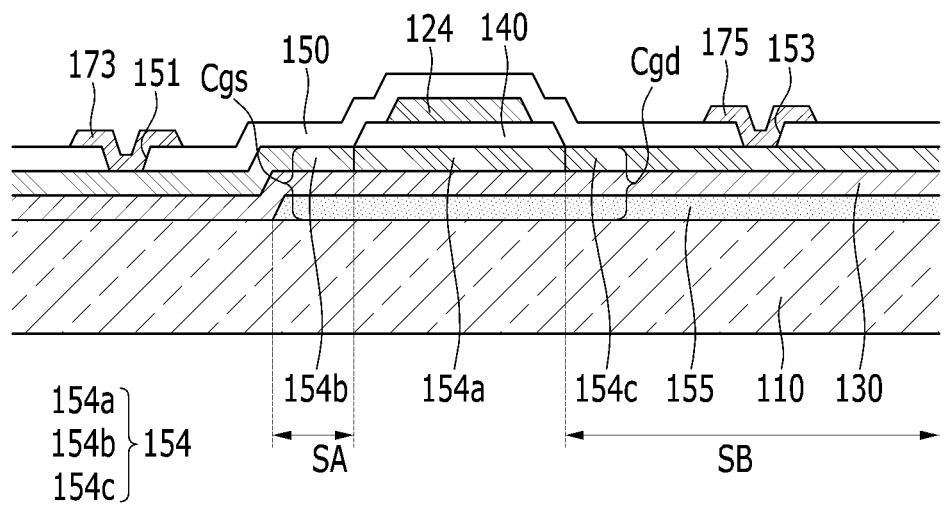
FIG. 5 is a cross-sectional view taken along a line V-V' of FIG. 4.
Figure 6:
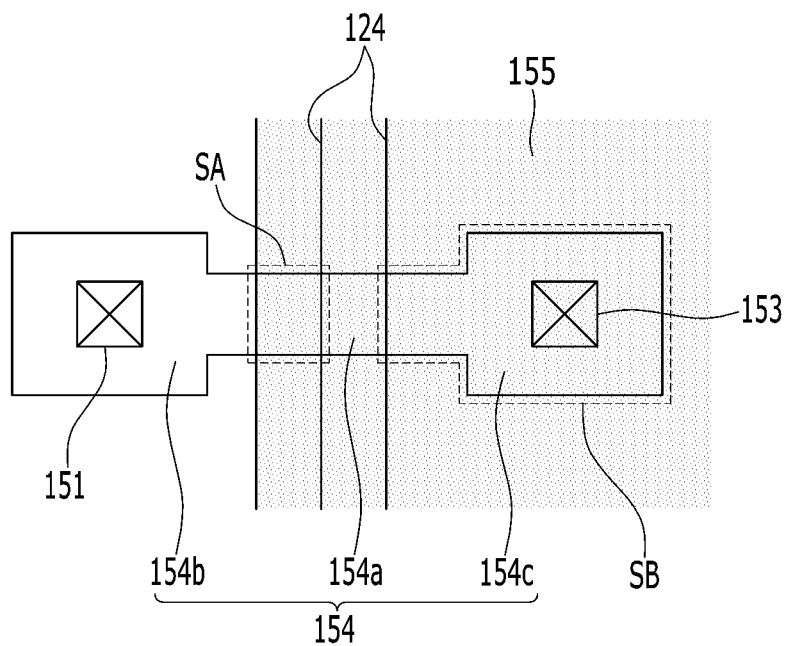
FIG. 6 is a top plan view schematically showing one thin film transistor of FIG. 4.
Figure 7:
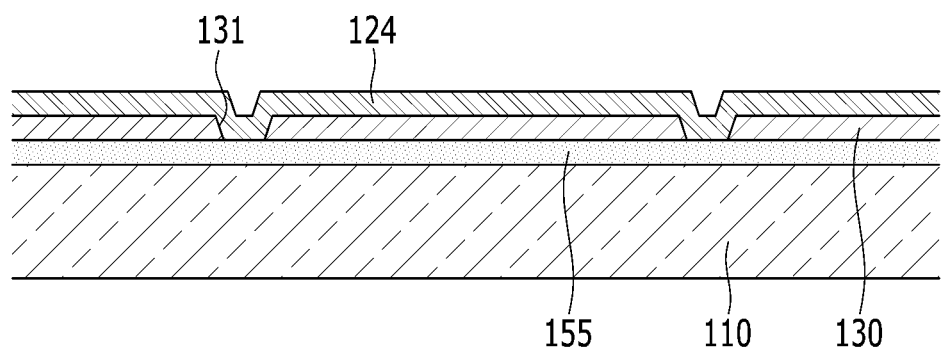
FIG. 7 is a cross-sectional view taken along a line VII-VII' of FIG. 4.
Figure 8:
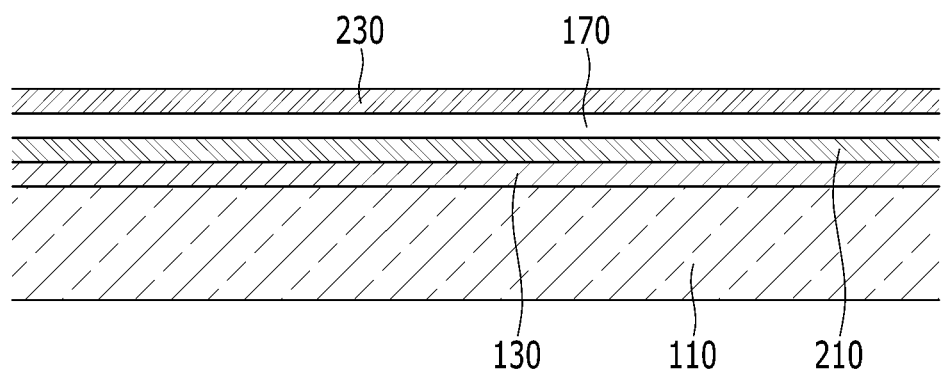
FIG. 8 is a cross-sectional view taken along a line VIII-VIII' of FIG. 4.

FIG. 4 is a layout view of a thin film transistor and a capacitor included in a gate driver of a display device according to an exemplary embodiment of the invention, FIG. 5 is a cross-sectional view taken along a line V-V' of FIG. 4, and FIG. 6 is a top plan view schematically showing one thin film transistor of FIG. 4. FIG. 7 is a cross-sectional view taken along a line VII-VII' of FIG. 4, and FIG. 8 is a cross-sectional view taken along a line VIII-VIII' of FIG. 4.

Referring to FIG. 4 to FIG. 8, the gate driver according to an exemplary embodiment includes a thin film transistor TR and a capacitor CAP. The thin film transistor TR shown in FIG. 4 corresponds to the first transistor T1 of the pull-up unit 530, and the capacitor CAP corresponds to the first capacitor C1 of the charge unit 520 illustrated in FIG. 3.

The gate driver may include a plurality of thin film transistors TR. The plurality of thin film transistors TR may be arranged in one line along an x-axis direction in the peripheral area PA of the display panel 300 (referring to FIG. 1). In detail, the semiconductor layer 154 of the thin film transistor TR extends along the x-axis direction. Also the plurality of thin film transistors TR arranged in one line along the x-axis direction may be repeatedly disposed along the y-axis direction with the same shape.

The capacitor CAP may be disposed at an end side of the plurality of thin film transistors TR disposed in the x-axis direction. In the exemplary embodiments, the capacitor CAP is disposed at a right end of the plurality of thin film transistors TR. In this case, the display area DA of the display panel 300 may be disposed at the right side of the capacitor CAP. That is, the capacitor CAP may be disposed between the plurality of thin film transistors TR and the display area DA. However, the exemplary embodiments are not limited thereto, and the capacitor CAP may be disposed at the left end of the plurality of thin film transistors TR. Accordingly, the plurality of thin film transistors TR may be disposed between the capacitor CAP and the display area DA.

In the exemplary embodiments, the thin film transistor TR includes a first gate electrode 155, a semiconductor layer 154, a second gate electrode 124, a source electrode 173, and a drain electrode 175.

The first gate electrode 155 is disposed on a substrate 110 made of an insulating material such as glass or plastic. The first gate electrode 155 is disposed under the semiconductor layer 154, such that the first gate electrode 155 is disposed to partially overlap the semiconductor layer 154. The overlapping structure of the first gate electrode 155 and the semiconductor layer 154 will be described later.

The first gate electrode 155 may be made of a metal such as copper (Cu), aluminum (Al), silver (Ag), molybdenum (Mo), chromium (Cr), tantalum (TA), and titanium (Ti), or metal alloys thereof. The first gate electrode 155 may be made of one conductive layer or may be made of a multilayer including at least two conductive layers made of different materials. In this case, the first gate electrode 155 may block the light transmitted to the semiconductor layer 154 through the substrate 110.

A first insulating layer 130 is disposed on the first gate electrode 155. The first insulating layer 130 may be made of an inorganic material such as a silicon nitride ($SiN_x$) or a silicon oxide ($SiO_x$). The first insulating layer 130 may have a multilayer structure in which at least two insulating layers having different physical properties are included. For example, the first insulating layer 130 may have a dual layer structure including a lower silicon nitride layer and an upper silicon oxide layer.

Referring to FIG. 5 and FIG. 6, the semiconductor layer 154 is disposed on the first insulating layer 130. The semiconductor layer 154 may overlap a part of the first gate electrode 155 in a direction perpendicular to the substrate 110.

The semiconductor layer 154 may be made of a channel region 154a, a source region 154b, and a drain region 154c. The first gate electrode 155 is disposed to overlap a part of the source region 154b, and entirety of the channel region 154a and drain region 154c. In FIG. 6, the first gate electrode 155 and the drain region 154c are entirely overlapped, however the exemplary embodiments are not limited thereto, and only a part of the drain region 154c may overlap the first gate electrode 155.

According to the exemplary embodiments, a first area SB where the first gate electrode 155 and the drain region 154c are overlapped is different from a second area SA where the first gate electrode 155 and the source region 154b are overlapped. The first gate electrode 155 does not overlap the same area of the source region 154b and the drain region 154c, respectively. That is, the first gate electrode 155 is biased in one of the source region 154b and the drain region 154c with respect to the channel region 154a.

In the present exemplary embodiment, the first area SB is formed to be larger than the second area SA. That is, as shown in FIG. 6, region that the first gate electrode 155 overlaps the drain region 154c is greater than region that first gate electrode 155 overlaps the source region 154b. According to the exemplary embodiments, an asymmetrical overlapping arrangement of the first gate electrode 155 and the semiconductor layer 154 may reduce the area of the capacitor CAP and in return, may reduce the peripheral area PA which is a dead space of the display device. That is, the width of the bezel of the display device may be reduced. The detailed description thereof will be given later.

The semiconductor layer 154 may be an oxide semiconductor. The semiconductor layer 154 may include at least a ternary-based semiconductor oxide containing a trivalent element (group 3A element) such as indium (In) and gallium (Ga) and/or a tetravalent element (group 4A element) such as tin (Sn), or a bivalent element (group 2B element) such as zinc (Zn) and oxygen (O). For example, the semiconductor layer 154 may be an indium-gallium-zinc oxide (IGZO) or an indium-tin-zinc oxide (ITZO). The semiconductor layer 154 may be formed of the single layer or the multilayer.

The second insulating layer 140 may be disposed on the semiconductor layer 154. The second insulating layer 140 may be the single layer or the multilayer. When the second insulating layer 140 is the single layer, the insulating material such as a silicon oxide ($SiO_x$), a silicon nitride ($SiN_x$), a silicon oxynitride (SiON), aluminum oxide ($Al_2O_3$), hafnium oxide ($HfO_3$), and yttrium oxide ($Y_2O_3$) may be included.

When the second insulating layer 140 is the multilayer, a lower layer contacted with the semiconductor layer 154 may include an insulating oxide such as a silicon oxide ($SiO_x$), aluminum oxide ($Al_2O_3$), hafnium oxide ($HfO_3$), and yttrium oxide ($Y_2O_3$). The lower layer of the second insulating layer 140 may improve the interface characteristic of the semiconductor layer 154 and may prevent an impurity from penetrating into the semiconductor layer 154, and at least one layer thereon may include the various insulating materials such as a silicon nitride ($SiN_x$) and a silicon oxide ($SiO_x$).

The second insulating layer 140 may cover most of the semiconductor layer 154. However, the exemplary embodiments not limited thereto, and the second insulating layer 140 may only cover the channel region 154a as the part of the semiconductor layer 154.

The second gate electrode 124 is disposed on the second insulating layer 140. The second gate electrode 124 connected to the above-described gate lines G1-Gn, and may be the gate conductor formed of the same material with the same layer as the gate line. For example, the second gate electrode 124 may be made of the metal such as copper (Cu), aluminum (Al), silver (Ag), molybdenum (Mo), chromium (Cr), tantalum (Ta), and titanium (Ti), or metal alloys thereof. The second gate electrode 124 may be made of one conductive layer or may be made of a multilayer including at least two conductive layers made of different materials.

The second gate electrode 124 overlaps the channel region 154a of the semiconductor layer 154 and the second insulating layer 140 is interposed therebetween.

Referring to FIG. 4 and FIG. 7, the second gate electrode 124 is electrically connected to the above-described first gate electrode 155. The first insulating layer 130 disposed between the first gate electrode 155 and the second gate electrode 124 may have a first contact hole 131. The first contact hole 131 may be disposed between the plurality of thin film transistors TR and the capacitor CAP. The first gate electrode 155 and the second gate electrode 124 are electrically connected through the first contact hole 131, and the semiconductor layer 154 is disposed between the first gate electrode 155 and the second gate electrode 124, thereby forming a dual gate structure.

Next, referring to FIG. 5, a third insulating layer 150 is disposed on the second gate electrode covering the second gate electrode 124 and the semiconductor layer 154. The third insulating layer 150 may include the inorganic insulating material such as a silicon oxide ($SiO_x$), a silicon nitride ($SiN_x$), a silicon oxynitride (SiON), and a silicon oxyfluoride (SiOF).

The third insulating layer 150 may have a single layer or a multilayer. When the third insulating layer 150 is the single layer, the third insulating layer 150 may include the inorganic insulating material such as a silicon oxide ($SiO_x$), a silicon nitride ($SiN_x$), a silicon oxynitride (SiON), and a silicon oxyfluoride (SiOF). Particularly, the third insulating layer 150 may include at least one of a silicon nitride ($SiN_x$) and a silicon oxynitride (SiON) including hydrogen (H) atoms injected into the source region 154b and the drain region 154c to reduce resistance in the source region 154b and the drain region 154c. The hydrogen (H) atoms may be injected by, for example, doping and infusion.

When the third insulating layer 150 is the multilayer, the lowest layer may include at least one of a silicon nitride ($SiN_x$) and a silicon oxynitride (SiON) that may be injected with hydrogen (H) atom in the source region 154b and the drain region 154c, and a middle layer or the upper layer including for example a silicon oxide ($SiO_x$) may be disposed on the lowest layer. When the third insulating layer 150 is the multilayer, another layer including the material such as a silicon nitride ($SiN_x$) or a silicon oxynitride (SiON) may be disposed on the middle layer including a silicon oxide ($SiO_x$).

The source region 154b and the drain region 154c may be formed by depositing the oxide semiconductor material on the substrate 110, and plasma treating the deposited oxide semiconductor material to be conductive. However, the source region 154b and the drain region 154c may have the low resistance by doping elements such as hydrogen (H) atoms generated from a gas such as silane ($SiH_4$) and ammonia ($NH_3$) which is used during the layer formation process of the third insulating layer 150, or by diffusing the elements such as hydrogen (H) atoms from the third insulating layer 150 after the layer formation of the third insulating layer 150.

The third insulating layer 150 may include a second contact hole 151 overlapping the source region 154b and a third contact hole 153 overlapping the drain region 154c.

The source electrode 173 and the drain electrode 175 of the data conductor are disposed on the third insulating layer 150. The source electrode 173 is connected to the source region 154b through the second contact hole 151 of the third insulating layer 150. Also, the drain electrode 175 is connected to the drain region 154c through the third contact hole 153 of the third insulating layer 150.

The source electrode 173 and the drain electrode 175 may be formed of the metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), and nickel (Ni), or metal alloys thereof. The source electrode 173 and the drain electrode 175 may be made of one conductive layer or may be made of a multilayer including at least two conductive layers made of different materials.

Referring to FIG. 4 and FIG. 8, the capacitor CAP includes a first capacitor electrode 210, a dielectric layer 170, and a second capacitor electrode 230.

The first capacitor electrode 210 is disposed on the first insulating layer 130 and is electrically connected to the second gate electrode 124. According to the exemplary embodiments, the first capacitor electrode 210 may be made of the same layer with the same material as the second gate electrode 124. For example, the first capacitor electrode 210 may be made of the metal such as copper (Cu), aluminum (Al), silver (Ag), molybdenum (Mo), chromium (Cr), tantalum (Ta), and titanium (Ti), or metal alloys thereof. The first capacitor electrode 210 may be made of one conductive layer or may be made of a multilayer including at least two conductive layers made of different materials.

The dielectric layer 170 may be disposed on the first capacitor electrode 210. For example, the dielectric layer 170 may be made of the inorganic material such as a silicon oxide and a silicon nitride.

The second capacitor electrode 230 may be disposed on the dielectric layer 170. The second capacitor electrode 230 may be disposed to overlap the first capacitor electrode 210. The second capacitor electrode 230 may be included in the data conductor along with the source electrode 173 and the drain electrode 175. That is, the second capacitor electrode 230 may be formed of the same material with the same layer as the source electrode 173 and the drain electrode 175.

For example, the second capacitor electrode 230 may be formed of the metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), and nickel (Ni), or metal alloys thereof. The source electrode 173 and the drain electrode 175 may be made of one conductive layer or may be made of a multilayer including at least two conductive layers made of different materials.

A process of reducing the area of the capacitor CAP through the asymmetrically overlapping arrangement of the first gate electrode 155 and the semiconductor layer 154 will be described with reference to FIG. 9.

Figure 9:
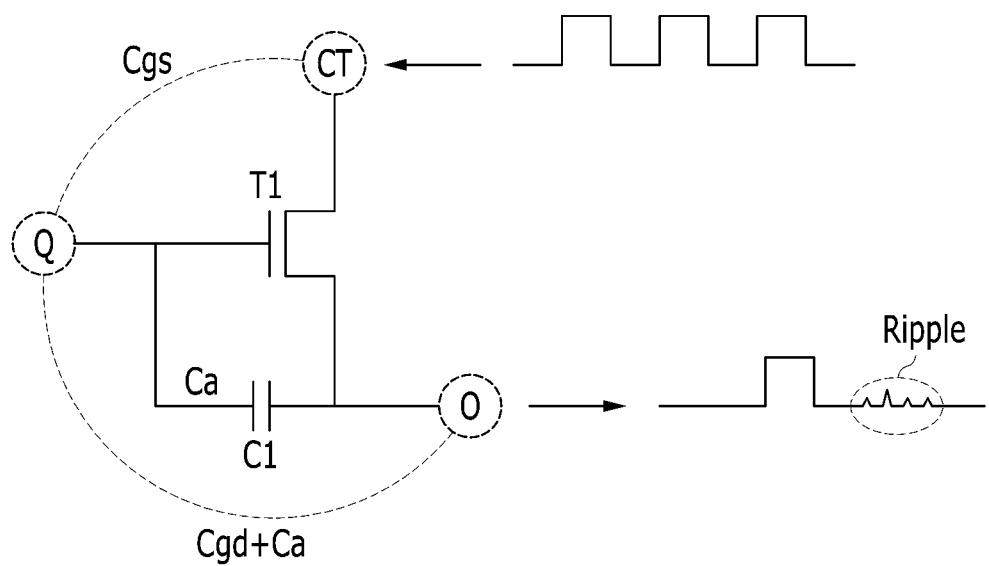
FIG. 9 is a view schematically showing a relation of a capacitance of a region X of FIG. 3.

FIG. 9 is a view schematically showing a relationship of capacitance of a region X of FIG. 3.

Referring to FIG. 9, the first transistor T1 of the pull-up unit 530 (referring to FIG. 3) may output the gate signal through the output node O. For example, the input of first transistor T1 may receive the clock signal CK through the clock terminal CT and output a single period of the clock signal CK as the gate signal through the output node O.

In this case, the ripple may be generated in the gate signal output through the output node O. To prevent the ripple from being generated in the output signal, the capacitance formed between the clock terminal T, the first node Q, and the output node O may be controlled.

The capacitance generated in the first transistor T1 and the first capacitor C1 of FIG. 9 may include a first parasitic capacitance Cgs formed by the first gate electrode 155 and the source region 154b of FIG. 5, a second parasitic capacitance Cgd formed by the first gate electrode 155 and the drain region 154c, and the first capacitance Ca formed by the first capacitor C1.

According to the exemplary embodiments, to prevent the ripple of the gate signal output through the output node O, a ratio of the first parasitic capacitance Cgs:(the second parasitic capacitance Cgd+the first capacitance Ca) may be 1:8 or more. For example, it must be satisfied that Cgs:(Cgd+Ca)=1:8, Cgs:(Cgd+Ca)=1:8.5, or Cgs:(Cgd+Ca)=1:9. For this, the value of (Cgd+Ca) is increased or the value of Cgs is decreased.

As a method to increase the value of the (Cgd+Ca), either the value Cgd and/or the value Ca may be increased. The value Ca may be increased by including the capacitance of the capacitor CAP of FIG. 4 corresponding to the first capacitor C1. The capacitance of the capacitor CAP is proportional to the area of the first capacitor electrode 210 and the second capacitor electrode 230. That is, to increase the capacitance of the capacitor CAP, the area of the first capacitor electrode 210 and the second capacitor electrode 230 must be increased. In this way, if the area of the first capacitor electrode 210 and the second capacitor electrode 230 is increased, the dead space of the display device is increased.

On the other hand, the second parasitic capacitance Cgd may be increased by increasing the first area SB which is the overlapping area of the first gate electrode 155 and the drain region 154c of FIG. 5.

Also, the value Cgs may be decreased by decreasing the second area SA which is the overlapping area of the first gate electrode 155 and the source region 154b.

To increase the first area SB and decrease the second area SA, as described above, the first gate electrode 155 is disposed to overlap a larger portion of the drain region 154c than the source region 154b. Accordingly, the first area SB that the first gate electrode 155 overlaps the drain region 154c may be greater than the second area SA that the first gate electrode 155 overlaps the source region 154b. In this way, by arranging the first gate electrode 155 to asymmetrically overlap with the source region 154b and the drain region 154c, the dead space of the display device may be reduced. Also, the ripple generated in the gate signal output through the output node O may be prevented or reduced.

Although certain exemplary embodiments and implementations have been described herein, other embodiments and modifications will be apparent from this description. Accordingly, the inventive concept is not limited to such embodiments, but rather to the broader scope of the appended claims and various obvious modifications and equivalent arrangements.

What is claimed is:

1. A display device comprising:
a substrate having a display area and a peripheral area; and
a driver circuit disposed in the peripheral area, the driver circuit comprising a thin film transistor disposed on the substrate, the thin film transistor comprising:
a first gate electrode disposed on the substrate;
a semiconductor layer disposed on the first gate electrode to overlap a part of the first gate electrode, the semiconductor layer comprising a channel region, a source region, and a drain region;
a second gate electrode disposed on the semiconductor layer overlapping the channel region; and
a source electrode and a drain electrode disposed on the semiconductor layer and connected to the source region and the drain region, respectively,
wherein a first area formed by the overlapping portion of the first gate electrode and the drain region has a different size than a second area formed by the overlapping portion of the first gate electrode and the source region, and
wherein the first gate electrode and the second gate electrode are electrically connected to each other.

2. The display device of claim 1, wherein the first area is larger than the second area.

3. The display device of claim 1, wherein the substrate comprises:
the display area where a plurality of pixels are disposed; and
the peripheral area enclosing the display area.

4. The display device of claim 3, wherein the driver circuit is disposed in the peripheral area, the driver circuit is configured to drive the plurality of pixels.

5. The display device of claim 1, further comprising a capacitor connected to the thin film transistor.

6. The display device of claim 5, wherein the capacitor comprises:
a first capacitor electrode disposed on the substrate;
a second capacitor electrode disposed on the first capacitor electrode; and
a dielectric layer interposed between the first capacitor electrode and the second capacitor electrode.

7. The display device of claim 5, wherein:
the capacitor has a first capacitance;
a first parasitic capacitance is formed by the first gate electrode and the source region;
a second parasitic capacitance is formed by the first gate electrode and the drain region; and
a ratio of the first parasitic capacitance:a sum of the second parasitic capacitance and the first capacitance is equal to 1:about 8 or more.

8. The display device of claim 6, wherein the first capacitor electrode is connected to the second gate electrode, and the second capacitor electrode is connected to the drain electrode.

9. The display device of claim 1, further comprising a first insulating layer disposed between the first gate electrode and the second gate electrode.

10. The display device of claim 9, wherein the first insulating layer has a first contact hole, and the first gate electrode and the second gate electrode are connected to each other through the first contact hole.

11. A display device comprising:

a substrate comprising a display area and a peripheral area; and a gate driver disposed in the peripheral area, the gate driver comprising:

a plurality of thin film transistors arranged in one line along a first direction, each of the plurality of thin film transistors comprising:

a first gate electrode;

a semiconductor layer disposed on the first gate electrode, the semiconductor layer comprising a channel region, a source region, and a drain region;

a source electrode and a drain electrode disposed on the semiconductor layer and connected to the source region and the drain region, respectively; and a second gate electrode disposed on the semiconductor layer, the second gate electrode overlapping the channel region; and a capacitor disposed adjacent to the plurality of thin film transistors; the capacitor comprises a first capacitor electrode and a second capacitor electrode, wherein a first area formed by the overlapping portion of the first gate electrode and the drain region has a different size than a second area formed by the overlapping portion of the first gate electrode and the source region, wherein the first capacitor electrode is electrically connected to the second gate electrode and the second capacitor electrode is electrically connected to the drain electrode of each of the plurality of thin film transistors, and wherein the first gate electrode and the second gate electrode are electrically connected to each other.

12. The display device of claim 11, wherein the first area is larger than the second area.

13. The display device of claim 11, wherein:

the source electrodes of each of the plurality of thin film transistors are formed of a first contiguous conductor;

the drain electrodes of each of the plurality of thin film transistors are formed of a second contiguous conductor;

the first gate electrodes of each of the plurality of thin film transistors are formed of a third contiguous conductor; and the second gate electrodes of each of the plurality of thin film transistors are formed of a fourth contiguous conductor.

14. The display device of claim 13, wherein:

the first capacitor electrode is formed of the same layer with the same material as the fourth contiguous conductor; and the second capacitor electrode is formed of the same layer with the same material as the second contiguous conductor.

15. The display device of claim 11, wherein:

the capacitor has a first capacitance;

a first parasitic capacitance is formed by the first gate electrode and the source region;

a second parasitic capacitance is formed by the first gate electrode and the drain region; and a ratio of the first parasitic capacitance:a sum of the second parasitic capacitance and the first capacitance is equal to 1:about 8 or more.

* * * * *